(12) United States Patent
Rivoir et al.

(10) Patent No.: US 9,847,843 B2
(45) Date of Patent: Dec. 19, 2017

(54) APPARATUS AND METHOD FOR WIRELESS TESTING OF A PLURALITY OF TRANSMIT PATHS AND A PLURALITY OF RECEIVE PATHS OF AN ELECTRONIC DEVICE

(75) Inventors: Jochen Rivoir, Magstadt (DE); Markus Rottacker, Stuttgart (DE); Andreas Hantsch, Boeblingen (DE)

(73) Assignee: ADVANTEST CORPORATION, Tokyo (JP)

( * ) Notice: Subject to any disclaimer, the term of this patent is extended or adjusted under 35 U.S.C. 154(b) by 1050 days.

(21) Appl. No.: 13/392,500

(22) PCT Filed: Aug. 28, 2009

(86) PCT No.: PCT/EP2009/006256
§ 371 (c)(1),
(2), (4) Date: Jun. 5, 2012

(87) PCT Pub. No.: WO2011/023211
PCT Pub. Date: Mar. 3, 2011

(65) Prior Publication Data
US 2012/0232826 A1 Sep. 13, 2012

(51) Int. Cl.
*G01R 31/00* (2006.01)
*G01D 1/00* (2006.01)
(Continued)

(52) U.S. Cl.
CPC ..... *H04B 17/0085* (2013.01); *G01R 31/3025* (2013.01); *H04B 7/0617* (2013.01);
(Continued)

(58) Field of Classification Search
CPC .............. G01R 31/3025; H04B 7/0617; H04B 17/0085; H04B 17/0002; H04B 17/004;
(Continued)

(56) References Cited

U.S. PATENT DOCUMENTS 7,773,964 B2 * 8/2010 Ozaki ..................... G01R 29/10
455/115.1
2002/0163478 A1 * 11/2002 Pleva .................. B60K 31/0008
343/853
(Continued)

OTHER PUBLICATIONS

M. Foegelle, "Over the air performance testing of wireless device sith multiple antennas", 2006.*
(Continued)

*Primary Examiner* — Eman Alkafawi

(57) ABSTRACT

An apparatus for wireless testing, wherein the apparatus includes a test interface, a test generator, a test module, and an analysis module. The test interface is coupled to an electronic device and is configured to transmit data to the electronic device and to receive data from the electronic device. The test generator drives the electronic device through the test interface to vary the beam direction. The test module determines a plurality of transmit values of a transmit parameter based on the test signal wirelessly received from the electronic device using at least one static antenna for receiving the test signal. Each transmit value of the transmit parameter is associated with a different beam direction. The analysis module provides an assessment of the plurality of transmit paths of the electronic device based on the plurality of transmit values.

23 Claims, 7 Drawing Sheets

(51) Int. Cl.
  *H04B 17/00* (2015.01)
  *G01R 31/302* (2006.01)
  *H04B 7/06* (2006.01)
  *H04B 7/08* (2006.01)
  *H04B 17/10* (2015.01)
  *H04B 17/20* (2015.01)

(52) U.S. Cl.
  CPC ........... *H04B 7/0837* (2013.01); *H04B 17/10* (2015.01); *H04B 17/20* (2015.01)

(58) Field of Classification Search
  CPC ...... H04B 7/0873; H04B 17/20; H04B 17/10; G06F 19/00
  USPC .................................................. 702/117, 122
  See application file for complete search history.

(56) References Cited

U.S. PATENT DOCUMENTS

| | | | |
|---|---|---|---|
| 2005/0176375 A1* | 8/2005 | Bednasz et al. | 455/67.12 |
| 2007/0243826 A1* | 10/2007 | Liu | 455/67.11 |
| 2008/0129615 A1* | 6/2008 | Breit et al. | 343/703 |
| 2009/0066356 A1* | 3/2009 | Slupsky et al. | 324/765 |
| 2009/0072843 A1* | 3/2009 | Slupsky et al. | 324/750 |
| 2010/0159930 A1* | 6/2010 | Hagerman | H01Q 3/04 455/436 |
| 2011/0006794 A1* | 1/2011 | Sellathamby et al. | 324/754.03 |

OTHER PUBLICATIONS

M. Otterskog, et al., "MOdelling of progagation environments inside a scattered field chamber", Technology Conference, IEEE 2005.*

* cited by examiner

APPARATUS AND METHOD FOR WIRELESS TESTING OF A PLURALITY OF TRANSMIT PATHS AND A PLURALITY OF RECEIVE PATHS OF AN ELECTRONIC DEVICE

CROSS-REFERENCES TO RELATED APPLICATIONS

This application is a Continuation of and claims priority to International Application No. PCT/EP2009/006256, filed on Aug. 28, 2009, titled "APPARATUS AND METHOD FOR WIRELESS TESTING OF A PLURALITY OF TRANSMIT PATHS AND A PLURALITY OF RECEIVE PATHS OF AN ELECTRONIC DEVICE," by Rivoir, et al, which is herein incorporated by reference.

TECHNICAL FIELD

The present disclosure relates generally to the field of electronic device testing systems and more specifically to the field of wireless testing of receive paths and transmit paths of electronic devices.

BACKGROUND

A current trend of new wireless integrated circuits exploits the advantage of millimeter wave radio frequencies, where the wavelength is short enough to enable antennas integrated on the die or in the package. The antenna and the connection to the antenna of these electronic devices become more important for radiation properties. Some of these integrated circuits use several antennas for beam steering (e.g. 16, 36, . . . ) and/or for multiple input multiple output MIMO (e.g. 4+4, . . . ) communication. These applications increase the demand of test systems capable of testing wireless dies or packaged chips.

Known systems carry out a conducted test of dies or packages. Each RF (radio frequency) port is connected to a test port of the test system. This test approach has several disadvantages. The probing must be done at millimeter wave frequencies and the number of antenna ports (16-36, . . . ) for beam steering devices and multiple input multiple output (MIMO) devices (4+4, . . . ) have to be connected during the test. Moreover, for devices with beam steering capabilities, the circuits responsible for beam steering must be tested (e.g. phase shifters on transmit (TX)/receive (RX) side, uniform gain or path to power amplifier (PA)/from low noise amplifier (LNA)). Therefore, the test time and the efforts in terms of test resources for testing such electronic devices are very high, which also results in enormous test expenditure.

SUMMARY OF THE INVENTION

Embodiments of this present invention provide a solution to the challenges inherent in testing a plurality of receive paths and transmit paths of an electronic device. Exemplary embodiments of the present invention provide an improved test concept for testing a plurality of transmit paths and/or a plurality of receive paths of an electronic device, which may allow for the reduction of the test time, the test efforts, and/or the test expenditure.

One exemplary embodiment of the invention provides an apparatus for wireless testing of a plurality of transmit paths of an electronic device capable of varying a beam direction of a test signal of the electronic device. The apparatus comprises a test interface coupled to the electronic device, a test generator, a test module, and an analysis module. The test interface is configured to transmit to, and receive data from, the electronic device. The test generator is configured to drive the electronic device through the test interface to vary the beam direction. Furthermore, the test module is configured to determine a plurality of test values of a transmit parameter wirelessly based on the test signal received from the electronic device by using at least one static antenna of the test module for receiving the test signal. Each transmit value of the transmit parameter is associated with a different beam direction. The analysis module is configured to provide an assessment of the plurality of transmit paths of the electronic device based on the plurality of transmit values.

One exemplary embodiment of the invention provides an apparatus for wireless testing of a plurality of receive paths of an electronic device capable of varying a preferred receiving direction of the electronic device. The apparatus comprises a test interface coupled to the electronic device, a test generator, a test module, and an analysis module. The test interface is configured to transmit data to the electronic device and to receive data from the electronic device. The test generator is configured to drive the electronic device through the test interface to vary the preferred receiving direction. The test module is further configured to transmit a test signal through at least one antenna of the test module to the electronic device. The analysis module is configured to provide an assessment of the plurality of receive paths based on a plurality of receive values received from the electronic device through the test interface. The plurality of receive values belongs to a plurality of receive parameters of the plurality of receive paths, wherein the plurality of receive values is determined by the electronic device. At least two receive values are determined for each receive parameter, wherein each receive value of a receive parameter is associated with a different preferred receiving direction.

In one exemplary embodiment of the present invention, a beam steering capability of an electronic device to be tested is used to wirelessly test transmit paths and/or receive paths of the electronic device. In this way, the test efforts in terms of test resources may be reduced since the RF ports do not have to be electrically connected via probe cards or probing tips. Therefore, the reliability of the test may be increased, since the stability of the connection of the probing tips to the probing pads of the RF ports of the electronic device has no influence anymore. Furthermore, the test time may be reduced by using the static antenna of the test module for a static test in comparison to a dynamic test, since the beam steering of the electronic device can be varied faster than the electronic device can be moved to different test positions during a dynamic test. In addition, several transmit and/or receive paths can be tested simultaneously or in rapid succession, which may be a second reason for a reduced test time.

Other exemplary embodiments of the invention relate to a test system, for wireless testing of a plurality of transmit and receive paths, of an electronic device. A common test interface, test generator, test module, and analysis module may be used for testing the plurality of transmit paths and the plurality of receive paths.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1:
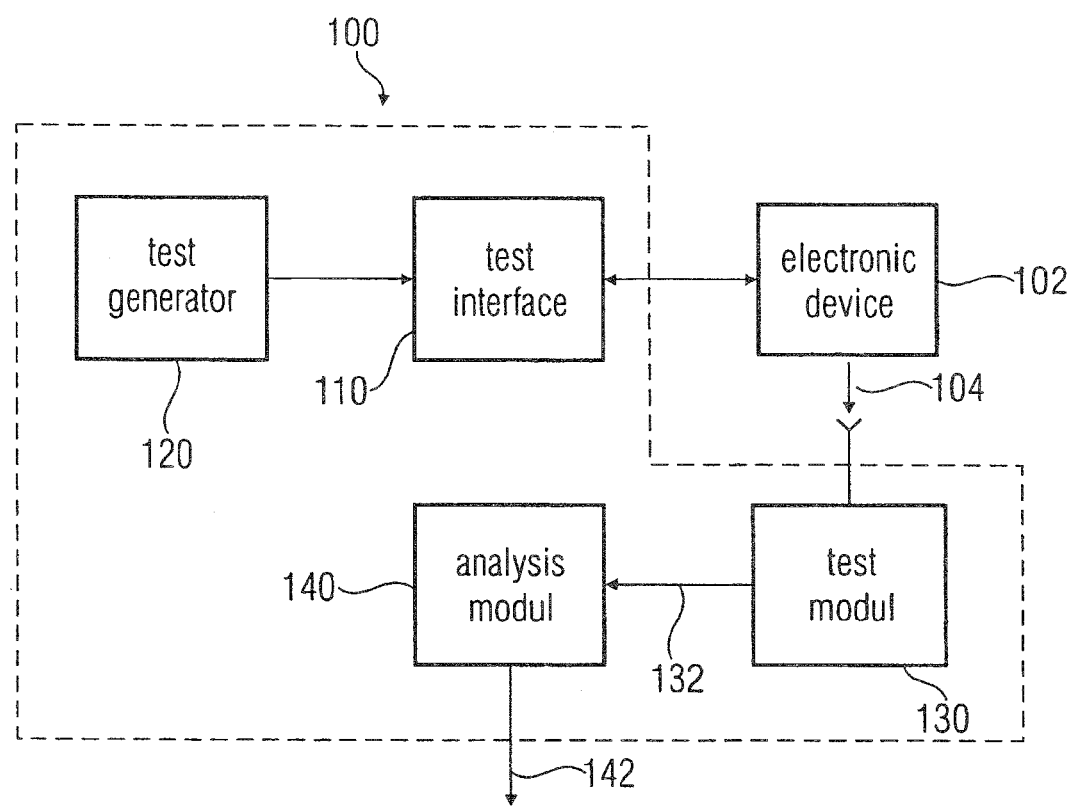
FIG. 1 illustrates an exemplary block diagram of an apparatus for wireless testing of a plurality of transmit paths of an electronic device.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide a solution to the challenges inherent in testing a plurality of receive paths and transmit paths of an electronic device. Exemplary embodiments of the present invention provide an improved test concept for testing a plurality of transmit paths and/or a plurality of receive paths of an electronic device, which may allow for the reduction of the test time, the test efforts, and/or the test expenditure.

FIG. 1 illustrates a block diagram of an exemplary apparatus 100 for wireless testing of a plurality of transmit paths of an electronic device 102 capable of varying a preferred direction of beam of a test signal according to an embodiment of the invention. In one embodiment, the apparatus 100 comprises a test interface 110 for coupling to the electronic device 102, a test generator 120, a test module 130, and an analysis module 140. The test generator 120 is connected to the test interface 110 and the test module 130 is connected to the analysis module 140. In one exemplary embodiment, the test interface 110 is operable to transmit data to the electronic device 102 and to receive data from the electronic device 102. The test generator 120 may drive the electronic device 102 through the test interface 110 to vary the preferred direction of beam. Further, the test module 130 may determine a plurality of transmit values 132 of a transmit parameter wirelessly, based on the test signal 104 received from the electronic device 102 by using at least one static antenna of the test module 130 for receiving the test signal 104. Each transmit value 132 of the transmit parameter may be associated with a different preferred direction of beam. The analysis module 140 may provide an assessment 142 of the plurality of transmit paths of the electronic device 102 based on the plurality of transmit values 132.

By using the capability of varying the direction of beam, also called beam steering capability, of the electronic device 102, the plurality of transmit paths can be tested wirelessly. Therefore, the RF ports of the transmit paths of the electronic device 102 must not be electrically connected for the test. In this way, the test efforts in terms of test resources may be significantly reduced. Further, several transmit paths may be tested simultaneously. In other words, all transmit paths used for adjusting the current direction of beam may be tested simultaneously which may also reduce the test time. Additionally, stability problems due to unstable electrical connections with the RF ports may be avoided, so that the test reliability may be increased. Furthermore, the test time may also be reduced by using the static antenna of the test module for a static test in comparison to a dynamic test, since the beam steering of the electronic device can be varied faster than the electronic device can be moved to different test positions during a dynamic test. Further, by simultaneously testing several transmit paths, the specifications for each single transmit path may be relaxed, since the direction of beam is a sum effect and slight deviations from the specifications of single transmit paths may compensate each other. Therefore, the yield of faultless tested devices may be increased.

The direction of beam of the test signal 104 sets the direction, in which the test signal is transmitted with the highest power. As discussed herein, each transmit value of the transmit parameter may be associated with a different preferred direction of beam. In other words, if the direction of beam is varied, the transmit parameter changes its value. Therefore, analyzing the transmit values 132 for different preferred directions of the beam may give an indication of the correct function of the beam steering capability of the electronic device 102. In this way, the analysis module 140 may be able to provide an assessment 142 of the plurality of transmit paths.

The transmit parameter may for example be related to the power, the amplitude, the energy, or another quantity related to the power, the amplitude, or the energy of the test signal 104 received by the at least one static antenna of the module test 130. This power or energy of the test signal 104 depends on the direction of beam and increases or decreases by varying the preferred direction of beam. Based on this increase or decrease of the power or the energy of the test signal 104, the analysis module 140 may determine the assessment 142 of the transmit paths. It may also be possible to determine more than one transmit parameter for each transmit path.

In one exemplary embodiment, the test generator 120 drives the electronic device 102 through the test interface 110. Driving the electronic device 102 means, for example, transmitting at least a start test signal to the electronic device 102 to force the electronic device 102 to start a test sequence. After receiving the start test signal, the electronic device 102 may start to vary the preferred direction of beam and transmitting the test signal 104. Alternatively, the test generator 120 may also transmit a clock signal to the electronic device 102 to synchronize the test system 100 and the electronic device 102. For this purpose the test generator 120 may also be connected to the analysis module 140 and/or the test module 130 to provide the clock signal and the start test signal to the analysis module 140 and/or the test module 130, so that the test system is synchronized with the electronic device 102. In another example, the test generator 120 transmits relative or absolute angles of the direction of beam to the electronic device 102. For example, the test generator 120 drives the electronic device 102 to change the preferred direction of beam by 1°, 10°, 30°, 60°, 90°, or another angle between 0° and 180° for each time interval. Alternatively, the test generator 120 may tell the electronic device 102 to set the direction of beam to a specific absolute angle for each time interval. Alternatively, the test generator 122 transmits a whole test pattern in terms of a plurality of test vectors to the electronic device 102 to drive the electronic device 102 into a desired test mode and/or to control the electronic device 102 during the test.

As mentioned before, the test signal 104 is received by a static antenna of the test module 130. This means, for example, in contrast to conventional methods for measuring a shape of a beam by varying the position of an antenna of a test system, the plurality of transmit paths can be assessed also with a static antenna by using the described concept. In other words, the relative position between the static antenna of the test system 100 and the electronic device 102 may stay constant during the test.

Further, the test generator may drive the electronic device 102 so that only a predefined number of selected transmit paths of the plurality of transmit paths are activated for a test interval so that the preferred direction of beam depends only on the selected transmit paths during the test interval. In other words, the direction and shape of the beam may be dependent only on the selected transmit paths during the test interval. The other transmit paths of the plurality of transmit paths may be deactivated for this test interval. For example, the transmit paths may be tested pair-wise. In this way, a possible failure of one of the transmit paths may be located easier than by a test of all transmit paths of the plurality of transmit paths simultaneously. Therefore, the analysis module 140 may assess the selected transmit paths during this test interval. Then, for example, the selected transmit paths may be varied for the next test intervals in order to select each transmit path of the plurality of transmit paths at least during one test interval. The analysis module 140 is thereby able to assess each transmit path.

The analysis module 140 may determine a gain parameter and/or a phase parameter for each transmit path based on the plurality of transmit values. These gain parameters and/or phase parameters may be compared with at least one reference gain parameter and/or phase parameter to assess the transmit paths. The determined gain parameter may be, for example, an absolute gain factor of the corresponding transmit path or a relative gain factor between different transmit paths. For example, different gain factors of transmit paths affect the preferred direction of beam, and in this way, the determined plurality of transmit values. Therefore, the analysis module 140 may draw conclusions from the plurality of transmit values. This may also be valid for the phase parameter. For example, the gain parameter of a transmit path depends on a gain of a power amplifier comprised by a transmit path. Therefore, the analysis module 140 may be able to assess the gain of the power amplifier and in this way, the correct function of the power amplifier, based on the gain parameter. Alternatively, the assessment of the power amplifier may be determined from the transmit parameters directly. In another example, the value of a corresponding phase parameter of a transmit path depends on the phase shift of a phase shifter, comprised by the transmit path. Therefore, this analysis module 140 may be able to assess the phase shift of the phase shifter and its correct function based on the phase parameter. Alternatively, the assessment of the phase shifter may be determined from the transmit parameters directly.

A transmit path of the electronic device may comprise a power amplifier, a phase shifter and an antenna. A signal to be transmitted by the electronic device may be amplified by the power amplifier, phase shifted by the phase shifter and transmitted by the antenna. Since the electronic device has a beam forming capability, the electronic device comprises a plurality of such transmit paths. In one exemplary embodiment, the test interface 110, the test generator 120, the test module 130, and the analysis module 140, may be separate hardware units or alternatively, part of a test board, a test system, a micro controller, a computer or automated test equipment (ATE).

Figure 2:
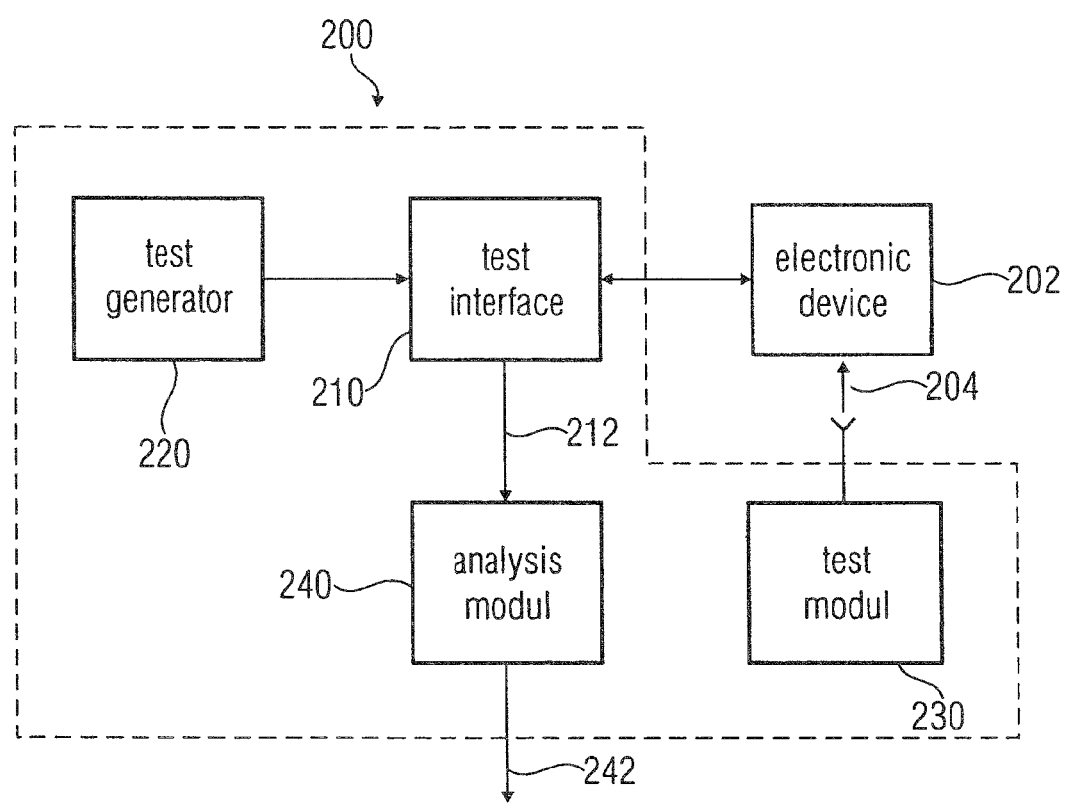
FIG. 2 illustrates an exemplary block diagram of an apparatus for wireless testing of a plurality of receive paths of an electronic device.

FIG. 2 illustrates a block diagram of an exemplary apparatus 200 for wireless testing of a plurality of receive paths of an electronic device 202 capable of varying a preferred receiving direction of the electronic device 102 according to an embodiment of the invention. The apparatus 200 comprises a test interface 210 for coupling to the electronic device 202, a test generator 220, a test module 230, and an analysis module 240. The test generator 220 is connected to the test interface 210 and the test interface 210 is connected to the analysis module 240. The test interface 210 is able to transmit data to the electronic device 202 and to receive data from the electronic device. The test generator 220 drives the electronic device through the test interface to vary the preferred receiving direction. Further, the test module 230 may transmit a test signal 204 through at least one static antenna of the test module 230 to the electronic device 102. The analysis module 240 may provide an assessment 242 of the plurality of receive paths based on a plurality of receive values 212 received from the electronic device 202 through the test interface 210. The plurality of receive values 212 belongs to a plurality of receive parameters of the plurality of receive paths, wherein the plurality of receive values 212 is determined by the electronic device 202. At least two receive values are determined for each receive parameter, wherein each receive value 212 of a receive parameter is associated with a different preferred receiving direction. In other words, at least one receive parameter is related to each receive path and the electronic device 202 determines values for each receive parameter for different receiving directions.

The advantages of the exemplary apparatus 200 are similar to the advantages already mentioned for the exemplary apparatus illustrated in FIG. 1. Instead of determining the transmit values by the test module, the electronic device 202 determines receive values and provides these receive values 212 to the analysis module 240 through the test interface 210. The receive values 212 may once again for instance be power, amplitude, or energy values, or other quantities related to the power, the amplitude, or the energy of the received test signal 204, which are increased or decreased, if the receiving direction is varied.

The detailed embodiments described for the apparatus for wireless testing of a plurality of transmit paths related to the gain parameter, the phase parameter, the selection of only a predefined number of transmit paths and/or the assessment of a power amplifier and/or a phase shifter comprised by a transmit path, may be easily adapted to an apparatus 200 for wireless testing of a plurality of receive paths. In most examples, the term "transmit path" must only be replaced by "receive path." A receive path of the electronic device may comprise an antenna, a phase shifter, and a low noise amplifier. A signal received by the antenna may be phase shifted by the phase shifter and amplified by the low noise amplifier. Since the electronic device has a beam forming capability, the electronic device comprises a plurality of such receive paths.

Figure 3:
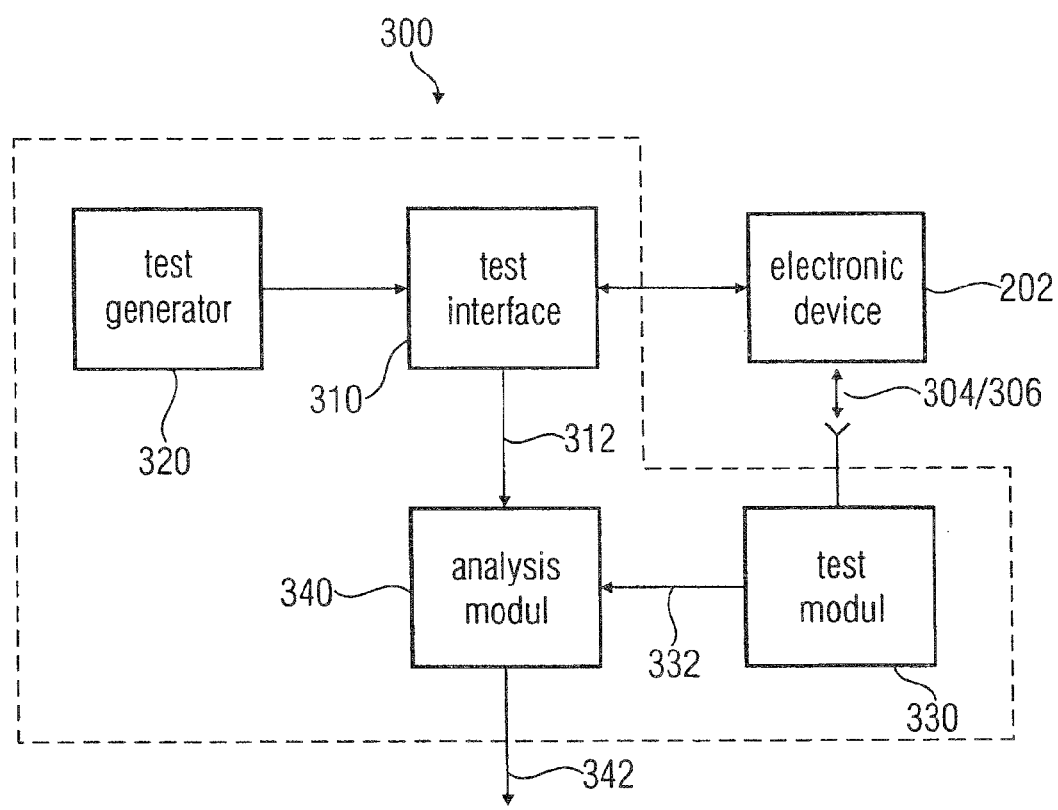
FIG. 3 illustrates an exemplary block diagram of a test system for wireless testing of a plurality of transmit paths and a plurality of receive paths of an electronic device.

FIG. 3 illustrates a block diagram of an exemplary test system 300 for wireless testing of a plurality of transmit paths and a plurality of receive paths of an electronic device 302 capable of varying a preferred direction of beam of a test signal and of varying a preferred receiving direction of the electronic device 302 according to an embodiment of the invention. The test system 300 comprises a test interface 310 for coupling to the electronic device 302, a test generator 320, a test module 330, and an analysis module 340. The test interface 310 is able to transmit data to the electronic device 302 and to receive data from the electronic device 302. The test generator 320 drives the electronic device 302 through the test interface 310 to vary the preferred direction of beam and/or the preferred receiving direction. Further, the test module 330 transmits a test signal 304 through at least one antenna of the test module 330 to the electronic device 302 and/or determines a plurality of transmit values 332 of a transmit parameter wirelessly based on the test signal 304 received from the electronic device 302 by using at least one static antenna of the test module 330 for receiving the test signal 304.

Each transmit value 332 of the transmit parameter is associated with a different preferred direction of beam. The analysis module 340 provides an assessment 342 of the plurality of transmit paths of the electronic device 302 based on the plurality of transmit values 332 and provides an assessment 342 of the plurality of receive paths based on a plurality of receive values 312 received from the electronic device 302 through the test interface 310. The plurality of receive values belongs to a plurality of receive parameters of the plurality of receive paths, wherein the plurality of receive values 312 is determined by the electronic device 302. At least two receive values are determined for each receive parameter, wherein each receive value 312 of a receive parameter is associated with a different preferred receiving direction.

The test system 300 combines an apparatus for wireless testing of a plurality of transmit paths, as illustrated in FIG. 1, and an apparatus for wireless testing of a plurality of receive paths, as illustrated in FIG. 2. Therefore, all examples and embodiments described before are also applicable to the test system 300.

Figure 4:
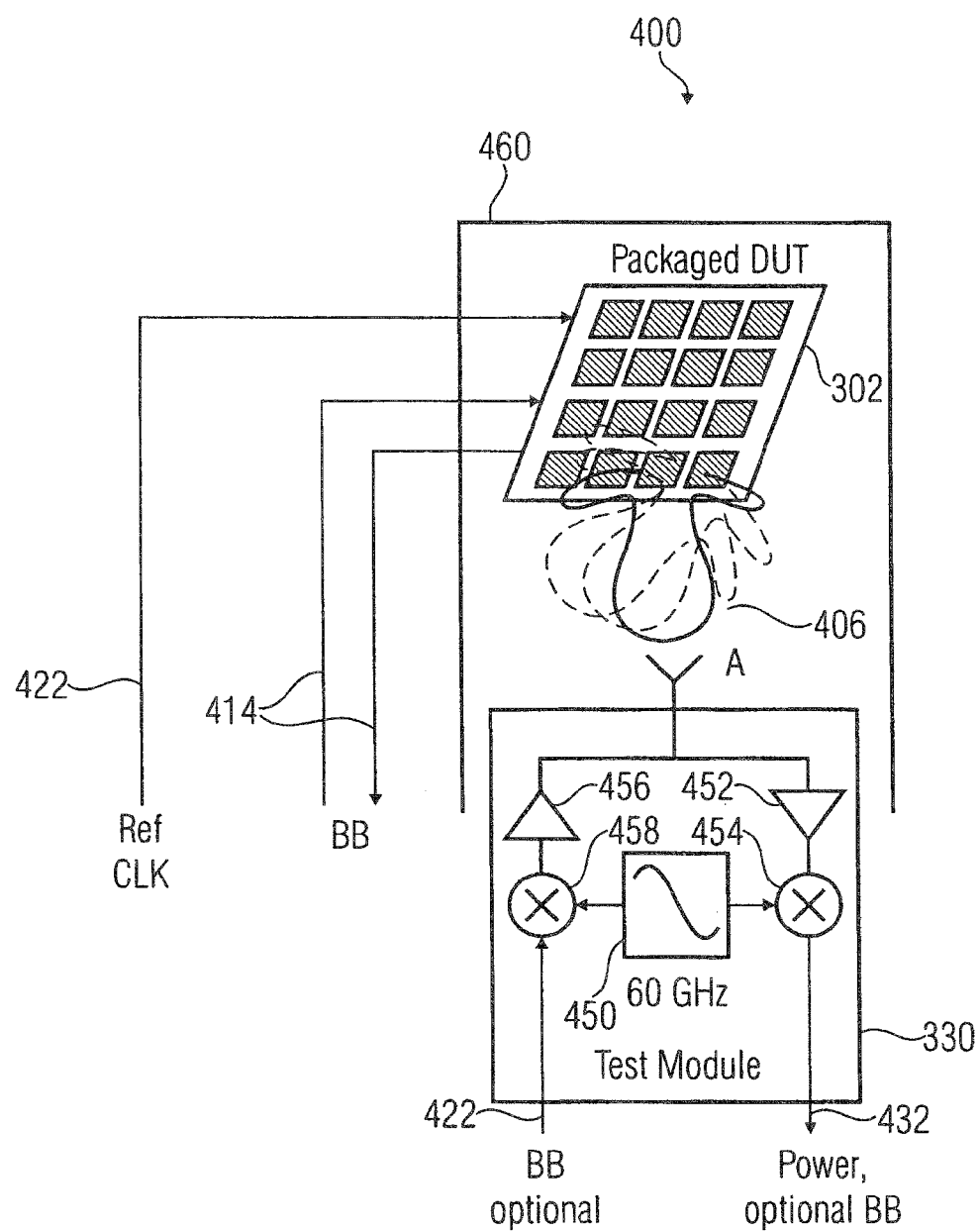
FIG. 4 illustrates an exemplary schematic diagram of a test module and an electronic device.

FIG. 4 illustrates a schematic 400 of an exemplary test module 330 as well as the electronic device 302 to be tested. In this example, the electronic device 302 is a packaged DUT (device-under-test) receiving a reference clock signal 422 (ref clk) and a baseband signal 414 (BB) from the test generator through the test interface and transmits a baseband signal 414 to the test interface. In addition, a schematic shape 406 of the beam is shown and different directions of the beam are indicated by the dashed lines.

In one exemplary embodiment, the test module comprises an oscillator 450 with a frequency of for instance 60 GHz (or a frequency between 100 MHz and 1000 GHz or another frequency in the millimeter wavelength region) connected to a mixer 458 of a transmit path 422 of the test module 330 and connected to a mixer 454 of a receive path 432 of the test module 330. The mixer 458 of the transmit path mixes the test signal up by the carrier frequency provided by the oscillator 450 (for instance 60 GHz), and the mixer 454 of the receive path 432 of the test module 330 may mix the test signal received from the electronic device 302 down to a base band frequency. Additionally, the transmit path 454 and the receive path 432 of the test module 330 comprise a power amplifier 456, 452, to amplify the test signal to be transmitted to the electronic device 302, or to amplify the test signal received from the electronic device 302. The test signal to be transmitted to the electronic device 302 may be, for example, a constant signal, a pulsed signal, or a signal containing base band data. The transmit parameter determined by the test module 330 based on the test signal received from the electronic device 302 may for example be power, amplitude or energy parameters, or optional base band data. Additionally, the test system may comprise an electromagnetic shielding 460 for protecting the DUT 302 and the test module 330 from external interference.

In one exemplary embodiment, the beam steering may be exploited for spatial and temporal power adjustment. For example, during the transmit (TX) test, the expected power at A (the at least one antenna of the test module 330) from each transmit (TX) antenna may verify the power amplifier (PA) and the antenna in the DUT 302. In addition, the expected power variation at the antenna A of the test module 330, when steering the transmit (TX) beam, may verify the transmit (TX) phase control. For the DUT 302 receive (RX) test, the expected power at each receive (RX) antenna (at each receive path), may verify the low noise amplifier (LNA) and the antenna. Moreover, varying the receive (RX) power when steering the receive (RX) beam may verify the receive (RX) phase control. This enables, for example, a radiated package test or a radiated die or wafer test.

In some embodiments according to the invention, the test module 330 comprises a reference device equal to the electronic device to be tested. The reference device may determine the plurality of transmit values of each transmit parameter or transmits the test signal. With this setup, it is for instance possible to vary a preferred direction of beam of the reference device during transmission of the test signal to the electronic device. In this way, the power of the test signal at the electronic device is varied. Therefore, the sensitivity of the electronic device or the sensitivity of the plurality of receive paths of the electronic device may be tested.

Figure 5:
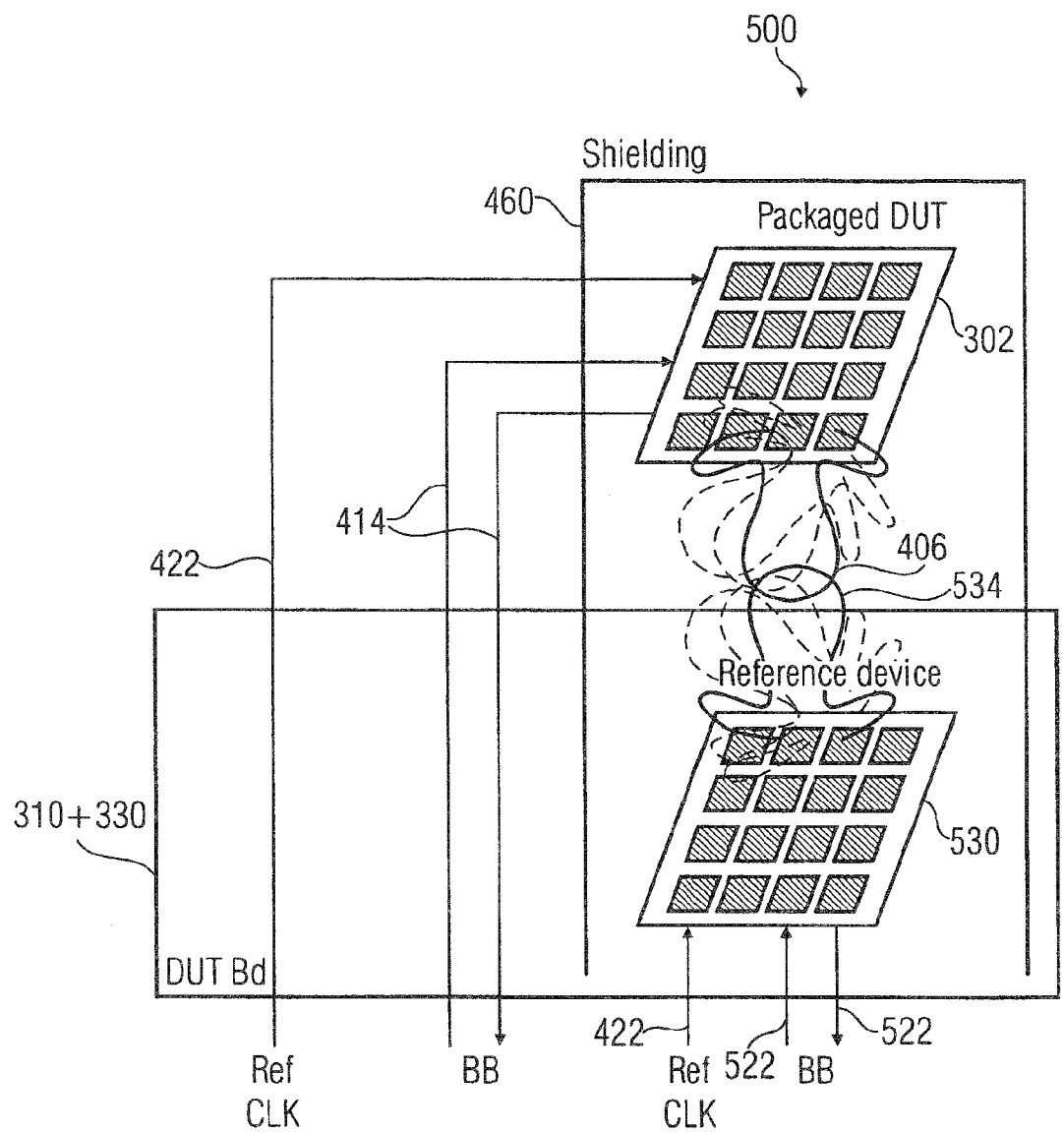
FIG. 5 illustrates an exemplary schematic diagram of an electronic device and a test interface combined with a test module comprising a reference device.

FIG. 5 illustrates a schematic illustration 500 of an exemplary electronic device 302 and a DUT board. The DUT board comprises the test interface 310 and the test module 330. The example shown in FIG. 5 is similar to the example shown in FIG. 4, but the test module 330 comprises a reference device 530 also capable of varying the direction of beam or the receiving direction. A shape 534 of the beam of the reference device 330 is additionally shown.

The reference device 530 may be driven by the test generator 320, for example, by a reference clock signal 422 and at least one base band signal 522. In the same manner, the reference device 530 provides a base band signal 522 to the analysis module and/or the test generator. In this way, a radiated package test, die test or wafer test with, for example, a 60 GHz device may be possible.

Using a test module 330 with a beam steering capability may enable a DUT receive (RX) sensitivity test. The beam steering of the test module 330 may be used to control the power at the DUT. The beam steering capability of the test module 330 may be, for example, realized by using a reference device 530, as shown in FIG. 5, or by implementing the beam steering capability directly to the test module 330. A full mission mode test may also be enabled. This for instance includes finding a beam, modulating and/or negotiating modulation modes.

In other exemplary embodiments, the test module is able to vary a power of the test signal at the electronic device and the analysis module may determine a threshold power based on the power variation of the test signal. Then, the analysis module may assess a receive path based on the threshold power. In other words, the power of the test signal may be increased, until the electronic device is able to correctly receive the test signal, which may also be called the "threshold power." A low threshold power may indicate a good receive path.

In some embodiments, the electronic device is a die on a wafer, a separated die or a packages chip, wherein each transmit path and each received path of the electronic device is connected to an antenna located on the die, or located in the package of the package chip.

Some embodiments according to the invention relate to a radiated RF test based on beam steering. For example, a radiated test of a wireless die or packaged chip involving beam steering is performed, where the beam steering capabilities of the DUT are exploited and/or the test system performs the beam steering.

Some advantages of the described concept are a scaling with very high carrier frequencies, a scaling with the number of antennas, a cost effective test of the beam steering capability in DUTs and/or a cost effective test of a MIMO functionality.

Some further embodiments according to the invention relate to a radiated test of a die or a packaged chip (e.g. not the full system) involving the beam steering (e.g. of the DUT and/or the test system). One aspect of this concept is for example testing of die beam steering DUTs. Another aspect is using test systems with beam steering capabilities. For example, the beam steering in the DUTs is used to test phase shifters and uniformity of power amplifiers (PA)/low noise amplifier (LNA)/antenna paths. Another example is using the beam steering of the test system to vary the transmit power and measure the uniformity of the power amplifier/low noise amplifier paths.

Other embodiments according to the invention relate to automated test equipment (ATE) comprising an apparatus for wireless testing of a plurality of transmit paths of an electronic device, an apparatus for wireless testing of a plurality of receive paths of an electronic device or an apparatus for wireless testing of a plurality of transmit paths and a plurality of receive paths of an electronic device.

Figure 6:
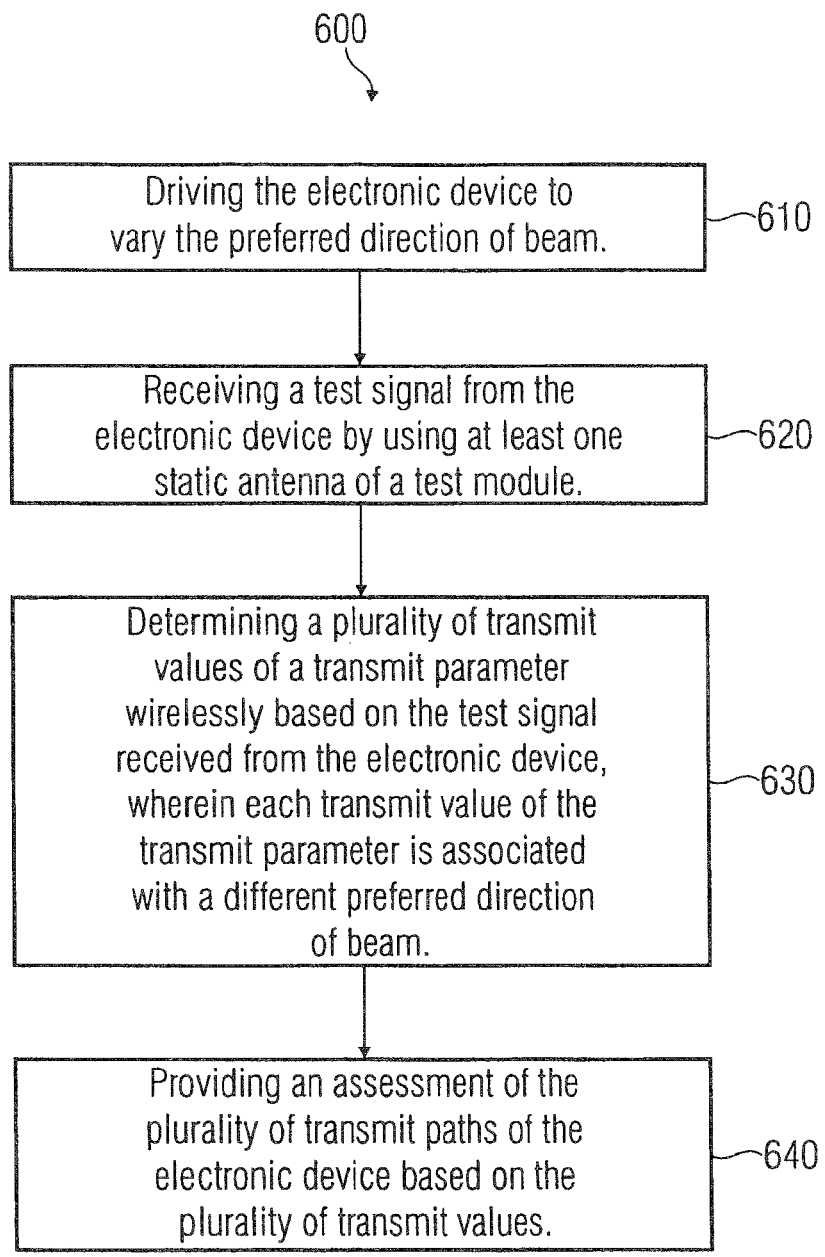
FIG. 6 illustrates an exemplary flow chart of a method for wireless testing of a plurality of transmit paths of an electronic device.

FIG. 6 illustrates a flow chart of an exemplary method 600 for wireless testing of a plurality of transmit paths of an electronic device capable of varying a preferred direction of beam of a test signal of the electronic device according to an embodiment of the invention. The method 600 comprises driving 610 the electronic device through the test interface to vary the preferred direction of beam, receiving 620 a test signal, determining 630 a plurality of transmit values, and providing 640 an assessment of the plurality of transmit paths of the electronic device. The plurality of transmit values of a transmit parameter may be determined wirelessly based on the received test signal, by using at least one static antenna of a test module for receiving the test signal. Each transmit value of the transmit parameter may be associated with a different preferred direction of beam. The assessment of the plurality of transmit paths of the electronic device is provided 640 based on the plurality of transmit values.

Figure 7:
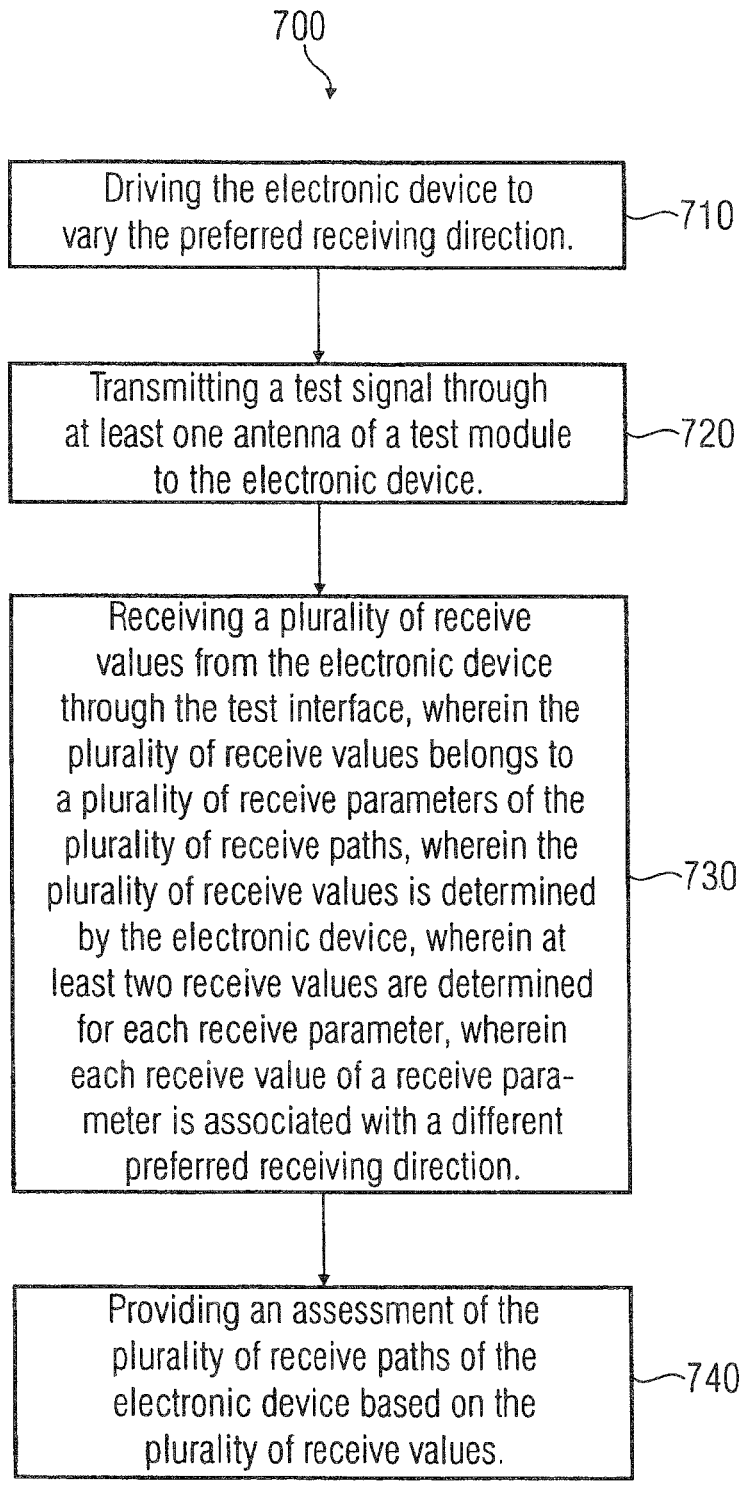
FIG. 7 illustrates an exemplary flow chart of a method for wireless testing of a plurality of receive paths of an electronic device.

FIG. 7 illustrates a flow chart of an exemplary method 700 for wireless testing of a plurality of receive paths of an electronic device capable of varying a preferred receiving direction of the electronic device according to an embodiment of the invention. The method 700 comprises driving 710 the electronic device to vary the preferred direction of beam, transmitting 720 a test signal through at least one antenna of a test module, receiving 730 a plurality of receive values from the electronic device through the test interface, and providing 740 an assessment of the plurality of receive paths. The plurality of receive values may belong to a plurality of receive parameters of the plurality of receive paths, wherein the plurality of receive values is determined by the electronic device. At least two receive values are determined for each receive parameter, wherein each receive value of a receive parameter is associated with a different preferred receiving direction. The assessment of the plurality of receive paths is provided 740, based on the plurality of receive values.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed. Generally, embodiments of the present invention can be implemented as a computer program product with a program code, the program code being operative for performing one of the methods when the computer program product runs on a computer. The program code may for example be stored on a machine readable carrier. Other embodiments comprise the computer program for performing one of the methods described herein, stored on a machine readable carrier. In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. A further embodiment of the inventive method is, therefore, a data stream or a sequence of signals representing the computer program for performing one of the methods described herein. The data stream or the sequence of signals may for example be configured to be transferred via a data communication connection, for example via the Internet. A further embodiment comprises a processing means, for example a computer, or a programmable logic device, configured to or adapted to perform one of the methods described herein. A further embodiment comprises a computer having installed thereon the computer program for performing one of the methods described herein. In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An apparatus for wireless testing using automated test equipment (ATE), the apparatus comprising:
    a test interface adapted to be coupled to an electronic device and configured to transmit data to and receive data from the electronic device;
    a test generator configured to drive the electronic device through the test interface to vary a beam direction of a test signal of the electronic device while maintaining a static test position of the electronic device;
    a test module configured to determine a plurality of transmit values of a transmit parameter, based on the test signal wirelessly received from the electronic device using at least one static antenna for receiving the test signal, wherein each transmit value of the transmit parameter is associated with a different beam direction; and
    an analysis module configured to provide an assessment of a plurality of transmit paths of the electronic device based on the plurality of transmit values, wherein each transmit path is associated with a different beam direction, and wherein the analysis module is further configured to determine one of a gain parameter and a phase parameter for each transmit path based on the plurality of transmit values.

2. The apparatus according to claim 1, wherein the analysis module is further configured to assess a transmit path based on one of its corresponding gain parameter and its corresponding phase parameter.

3. The apparatus according to claim 2, wherein the analysis module is further configured to provide the assessment based on a comparison of a gain parameter of each transmit path with at least one reference gain parameter or based on a comparison of a phase parameter of each transmit path with at least one reference phase parameter.

4. The apparatus according to claim 2, wherein the gain parameter is an absolute gain factor of a transmit path or a relative gain factor between different transmit paths.

5. The apparatus according to claim 2, wherein the value of a corresponding gain parameter of a transmit path depends on a gain of a power amplifier comprised by the transmit path, and wherein the analysis module is configured to assess the gain of the power amplifier based on the gain parameter.

6. The apparatus according to claim 2, wherein a value of the corresponding phase parameter of a transmit path depends on a phase shift of a phase shifter comprised by the transmit path, wherein the analysis module is configured to assess the phase shift of the phase shifter based on the phase parameter.

7. The apparatus according to claim 1, wherein the test generator is further configured to drive the electronic device so that a predefined number of selected transmit paths of the plurality of transmit paths is activated for a test interval, wherein the beam direction depends on the selected transmit paths during the test interval, and wherein the analysis module is further configured to assess the selected transmit paths during the test interval.

8. The apparatus according to claim 7, wherein the selected transmit paths are varied for different test intervals, so that each transmit path of the plurality of transmit paths is selected at least during one test interval.

9. An apparatus for wireless testing using automated test equipment (ATE), the apparatus comprising:
    a test interface adapted to be coupled to the electronic device and configured to transmit data to and receive data from the electronic device;

a test generator configured to drive the electronic device through the test interface to vary a receiving direction while maintaining a static test position of the electronic device;

a test module configured to transmit a test signal through at least one static antenna to the electronic device; and an analysis module configured to provide an assessment of a plurality of receive paths based on a plurality of receive values received from the electronic device through the test interface, wherein each receive path is associated with a different receiving direction, wherein the plurality of receive values belongs to a plurality of receive parameters of the plurality of receive paths, wherein the plurality of receive values is determined by the electronic device, wherein at least two receive values are determined for each receive parameter, and wherein further each receive value of a receive parameter is associated with a receiving direction, wherein the analysis module is further configured to determine a gain parameter or a phase parameter for each receive path based on the plurality of receive values.

10. The apparatus according to claim 9, wherein the analysis module is further configured assess a receive path based on the corresponding gain parameter or the corresponding phase parameter.

11. The apparatus according to claim 10, wherein the analysis module is further configured to provide an assessment based on a comparison of the gain parameter of each receive path with at least one reference gain parameter, or based on a comparison of the phase parameter of each receive path with at least one reference phase parameter.

12. The apparatus according to claim 10, wherein the gain parameter is an absolute gain factor of a receive path or a relative gain factor between different receive paths.

13. The apparatus according to claim 10, wherein a value of the corresponding gain parameter of a receive path depends on a gain of a power amplifier comprised by the receive path, and wherein the analysis module is further configured to assess the gain of the power amplifier based on the gain parameter.

14. The apparatus according to claim 10, wherein the value of a corresponding base parameter of a receive path depends on a phase shift of a phase shifter comprised by the receive path, wherein the analysis module is configured to assess the phase shift of the phase shifter based on the phase parameter.

15. The apparatus according to claim 9, wherein the test generator is further configured to drive the electronic device, wherein a predefined number of selected receive paths of the plurality of receive paths is activated for a test interval, so that the receiving direction depends only on the selected receive paths during the test interval, and wherein the analysis module is further configured to assess the selected receive paths during the test interval.

16. Apparatus according to claim 15, wherein the selected receive paths are varied for different test intervals, so that each receive path of the plurality of receive paths is selected at least during one test interval.

17. A test system for wireless testing using automated test equipment (ATE), the test system comprising:

a test interface adapted to be coupled to the electronic device and configured to transmit data to and receive data from the electronic device;

a test generator configured to drive the electronic device through the test interface to vary a beam direction of a test signal and a receiving direction of the electronic device while maintaining a static test position of the electronic device;

a test module configured to transmit a test signal through at least one static antenna of the test module to the electronic device and configured to determine a plurality of transmit values of a transmit parameter based on the test signal wirelessly received from the electronic device by using at least one static antenna for receiving the test signal, wherein each transmit value of the transmit parameter is associated with a different beam direction; and an analysis module configured to provide an assessment of a plurality of transmit paths of the electronic device based on the plurality of transmit values and configured to provide an assessment of a plurality of receive paths based on a plurality of receive values received from the electronic device through the test interface, wherein each transmit path is associated with a different beam direction, wherein each receive path is associated with a different receiving direction, wherein the plurality of receive values belongs to a plurality of receive parameters of the plurality of receive paths, wherein the plurality of receive values is determined by the electronic device, wherein at least two receive values are determined for each receive parameter, and wherein further each receive value of a receive parameter is associated with a different receiving direction, wherein the analysis module is further configured to determine a gain parameter or a phase parameter for each receive path based on the plurality of receive values.

18. The test system according to claim 17, wherein the test module comprises a reference device equal to the electronic device to be tested, wherein the reference device is configured to determine a plurality of transmit values of each transmit parameter or configured to transmit the test signal.

19. The test system according to claim 18, wherein a beam direction of the reference device is varied while transmitting the test signal to vary a power, an amplitude or an energy of the test signal at the electronic device.

20. The test system according to claim 19, wherein the test module is further configured to vary a power of the test signal at the electronic device, and wherein the analysis module is further configured to determine a threshold power based on a power variation of the test signal and to assess a receive path based on the threshold power.

21. The test system according to claim 20, wherein the electronic device is a die on a wafer, a separated die or a packaged chip, and wherein each transmit path and each receive path of the electronic device is connected to an antenna located on the die or located in the package of the packaged chip.

22. A method for wireless testing using automated test equipment (ATE), the method comprising:

driving an electronic device to vary a beam direction of a test signal while maintaining a static test position of the electronic device;

receiving the test signal from the electronic device using at least one static antenna of a test module;

determining a plurality of transmit values of a transmit parameter based on the test signal wirelessly received from the electronic device, wherein each transmit value of the transmit parameter is associated with a different beam direction; and providing an assessment of a plurality of transmit paths of the electronic device based on the plurality of transmit values, wherein each transmit path is associated with a different beam direction, and wherein the assessment comprises one of a gain parameter and a phase parameter for each transmit path based on the plurality of transmit values.

23. A method for wireless testing using automated test equipment (ATE), the method comprising:

driving an electronic device to vary a receiving direction of a test signal while maintaining a static test position of the electronic device;

transmitting the test signal through at least one static antenna to the electronic device;

receiving a plurality of receive values from the electronic device through a test interface, wherein the plurality of receive values correspond to a plurality of receive parameters of the plurality of receive paths, wherein the plurality of receive values is determined by the electronic device, wherein at least two receive values are determined for each receive parameter, and wherein each receive value of a receive parameter is associated with a different receiving direction; and providing an assessment of a plurality of receive paths of the electronic device based on the plurality of receive values, wherein each receive path is associated with a different receiving direction, wherein the analysis module is further configured to determine a gain parameter or a phase parameter for each receive path based on the plurality of receive values.

* * * * *